(12) United States Patent
Chen et al.

(10) Patent No.: US 12,249,489 B2
(45) Date of Patent: Mar. 11, 2025

(54) OPTICAL DEVICE IMPROVEMENT

(71) Applicant: Applied Materials, Inc., Santa Clara, CA (US)

(72) Inventors: Yue Chen, Sunnyvale, CA (US); Jinyu Lu, Santa Clara, CA (US); Yongmei Chen, San Jose, CA (US); Jinxin Fu, Fremont, CA (US); Zihao Yang, Santa Clara, CA (US); Mingwei Zhu, San Jose, CA (US); Takashi Kuratomi, San Jose, CA (US); Rami Hourani, Santa Clara, CA (US); Ludovic Godet, Sunnyvale, CA (US); Qun Jing, Santa Clara, CA (US); Jingyi Yang, Santa Clara, CA (US); David Masayuki Ishikawa, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 18/131,997

(22) Filed: Apr. 7, 2023

(65) Prior Publication Data
US 2023/0360890 A1    Nov. 9, 2023

Related U.S. Application Data

(60) Provisional application No. 63/352,854, filed on Jun. 16, 2022, provisional application No. 63/363,773, (Continued)

(51) Int. Cl.
*H01J 37/32* (2006.01)
*H01J 7/02* (2006.01)

(52) U.S. Cl.
CPC .......... *H01J 37/32449* (2013.01); *H01J 7/02* (2013.01); *H01J 37/32458* (2013.01); (Continued)

(58) Field of Classification Search
CPC .. H01J 37/32449; H01J 7/02; H01J 37/32458; H01J 37/32724;
(Continued)

(56) References Cited

U.S. PATENT DOCUMENTS

| 2003/0063883 A1 | 4/2003 | Demaray et al. |
| 2020/0213579 A1 | 7/2020 | Mohanty |

(Continued)

FOREIGN PATENT DOCUMENTS

| JP | 2014029561 A | * | 2/2014 | ........... G02B 26/001 |
| JP | 2019521391 A |   | 7/2019 | |
| WO | WO-2019103871 A1 | * | 5/2019 | ............ H01P 11/002 |

OTHER PUBLICATIONS

International Search Report and Written Opinion dated Jul. 31, 2023 for Application No. PCT/US2023/017861.

*Primary Examiner* — Abdullah A Riyami
*Assistant Examiner* — Syed M Kaiser
(74) *Attorney, Agent, or Firm* — Patterson + Sheridan, LLP (57) ABSTRACT

A method of processing an optical device is provided, including: positioning an optical device on a substrate support in an interior volume of a process chamber, the optical device including an optical device substrate and a plurality of optical device structures formed over the optical device substrate, each optical device structure including a bulk region formed of silicon carbide and one or more surface regions formed of silicon oxycarbide. The method further includes providing one or more process gases to the interior volume of the process chamber, and generating a plasma of the one or more process gases in the interior volume for a first time period when the optical device is on the substrate support, and stopping the plasma after the first time period. A carbon content of the one or more surface (Continued)

regions of each optical device structure is reduced by at least 50% by the plasma.

20 Claims, 5 Drawing Sheets

Related U.S. Application Data filed on Apr. 28, 2022, provisional application No. 63/362,935, filed on Apr. 13, 2022.

(52) U.S. Cl.
CPC ... *H01J 37/32724* (2013.01); *H01J 2237/332* (2013.01); *H01J 2237/334* (2013.01)

(58) Field of Classification Search
CPC ........... H01J 2237/332; H01J 2237/334; H01J 37/32403; G02B 27/0081; G02B 2027/0125; G02B 1/11; G02B 1/12; G02B 27/0172

See application file for complete search history.

(56) References Cited

U.S. PATENT DOCUMENTS

| | | | |
|---|---|---|---|
| 2020/0264353 A1* | 8/2020 | Mohanty | G02B 5/1852 |
| 2022/0221788 A1* | 7/2022 | Jiang | G02B 27/0172 |

\* cited by examiner

OPTICAL DEVICE IMPROVEMENT

CROSS-REFERENCE TO RELATED APPLICATIONS

This application claims priority to: (1) U.S. Provisional Patent Application Ser. No. 63/362,935, filed on Apr. 13, 2022; (2) U.S. Provisional Patent Application Ser. No. 63/363,773, filed on Apr. 28, 2022; and (3) U.S. Provisional Patent Application Ser. No. 63/352,854, filed on Jun. 16, 2022, which are each incorporated by reference in their entirety.

BACKGROUND

Embodiments of the present disclosure generally relate to optical devices. More specifically, embodiments described herein relate to improved optical devices and methods of improving the optical properties of one or more surface regions of optical devices.

DESCRIPTION OF THE RELATED ART

Optical devices, such as augmented reality waveguide combiners, are used for overlaying images for users. Generated light is propagated through the optical device until the light exits the optical device and is overlaid on the ambient environment for the user. Absorption of light inside the optical device can reduce the efficiency of the optical device as well diminish the user's experience due to reduced intensity of images output by the optical device. Although efforts have been made to reduce the absorption of light inside optical devices, absorption of light remains a problem.

Accordingly, what is needed in the art are optical devices and methods of forming optical devices that further reduce the absorption of light inside optical devices.

SUMMARY

In one embodiment, a method of processing an optical device is provided, comprising: positioning an optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide; providing one or more process gases to the interior volume of the process chamber; generating a plasma of the one or more process gases in the interior volume of the process chamber for a first time period when the optical device is on the substrate support; and stopping the plasma after the first time period, wherein a carbon content of the one or more surface regions of each optical device structure is reduced by at least 50% compared to the carbon content of the one or more surface regions of each optical device structure before the first time period.

In another embodiment, a method of processing an optical device is provided, comprising: positioning an optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide; providing one or more process gases to the interior volume of the process chamber; heating the interior volume of the process chamber to a temperature of at least 600° C. for a first time period when the optical device is on the substrate support; and stopping the heat after the first time period, wherein a carbon content of the one or more surface regions of each optical device structure is reduced by at least 50% compared to the carbon content of the one or more surface regions of each optical device structure before the first time period.

In another embodiment, a method of processing an optical device is provided, comprising: positioning an optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide, wherein the optical device substrate is formed of silicon carbide and the plurality of optical device structures are gratings configured for use in a waveguide combiner; providing one or more process gases including hydrogen to the interior volume of the process chamber; exposing the optical device to a plasma generated from the one or more process gases for a first time period when the optical device is on the substrate support; and stopping the plasma after the first time period, wherein a carbon content of the one or more surface regions of each optical device structure is reduced by at least 80% compared to the carbon content of the one or more surface regions of each optical device structure before the first time period.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the present disclosure and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to improved optical devices and methods of improving the optical properties of one or more surface regions of optical devices. Optical device structures (e.g., optical gratings for a waveguide combiner) are often formed of silicon carbide due to the refractive index and other optical properties of silicon carbide. These silicon carbide optical device structures are often formed on substrates formed of silicon carbide. Forming the optical device structures on silicon carbide substrates using methods, such as ion-beam etching (IBE), can result in regions near the surface of the optical device structures and substrate being formed of silicon oxycarbide due to gases (e.g., oxides) used in the process. These silicon oxycarbide regions can cause high levels of optical loss and diminish the optical performance of the optical device.

Disclosed herein are methods and related process equipment that can substantially reduce the carbon content of these silicon oxycarbide regions (e.g., >50% reduction) formed over the optical device structures and the substrate, so that the optical loss caused by the silicon oxycarbide regions is substantially reduced. In one embodiment, a plasma treatment process is performed to substantially reduce the carbon content in the surface regions of the optical device structures and substrate. In another embodiment, an annealing process is performed with one or more process gases to substantially reduce the carbon content in the surface regions of the optical device structures and substrate. These methods can be used to improve the optical performance of the optical device and restore the optical loss to levels substantially the same as optical loss levels of the material (e.g., silicon carbide) before the process (e.g., IBE) used to form the optical device structures is performed. In some embodiments, these methods can improve the optical device efficiency for red light, green light, and blue light by at least 50%, such as by at least 70%. In some embodiments, these methods can improve the optical device efficiency for green light by at least 100%, such as by at least 149%. In some embodiments, these methods can improve the optical device efficiency for green light by at least 100%, such as by at least 260%.

Figure 1:
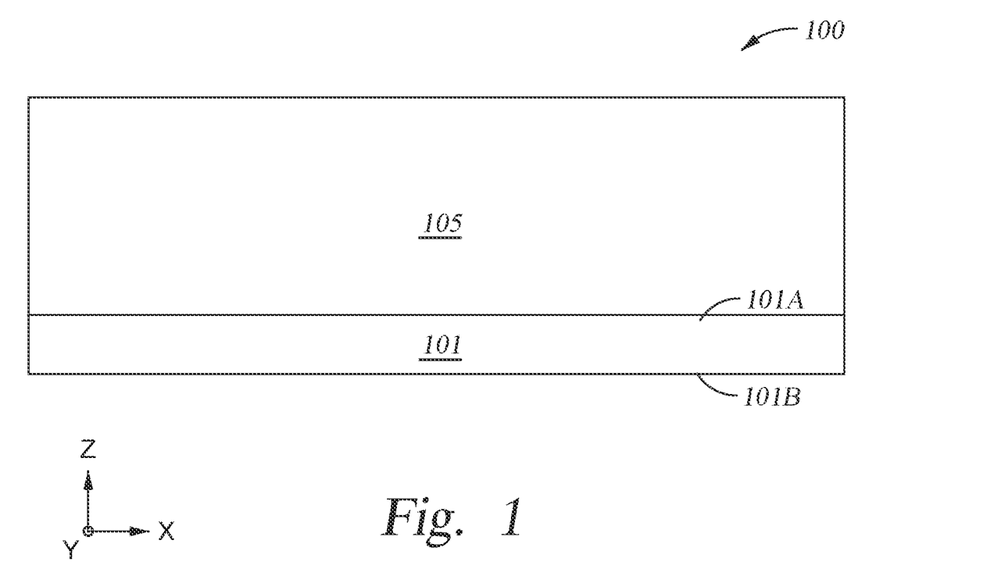
FIG. 1 is a cross-sectional view of an optical device, according to one embodiment.

FIG. 1 is a cross-sectional view of an optical device 100, according to one embodiment. The optical device 100 includes an optical device substrate 101 and an optical device film 105. The optical device substrate 101 includes a first surface 101A and an opposing second surface 101B. The optical device film 105 is disposed over the first surface 101A of the optical device substrate 101. In some embodiments, the optical device film 105 is disposed directly on the first surface 101A of the substrate 101.

In some embodiments, which can be combined with other embodiments described herein, the optical device substrate 101 can be formed of an optically transparent material. In some embodiments, the optical device substrate 101 can be formed of silicon carbide.

The optical device film 105 can also be formed of silicon carbide. In some embodiments, the optical device film 105 can be formed of another optically transparent material, for example another optically transparent material including silicon and/or carbon. In some embodiments, the optical device film 105 can be formed over the optical device substrate 101 using chemical vapor deposition (CVD), plasma-enhanced CVD, or physical vapor deposition among other techniques. In other embodiments, there is not a separate film 105 and the optical device structures described below can be formed by etching a silicon carbide substrate.

Figure 2:
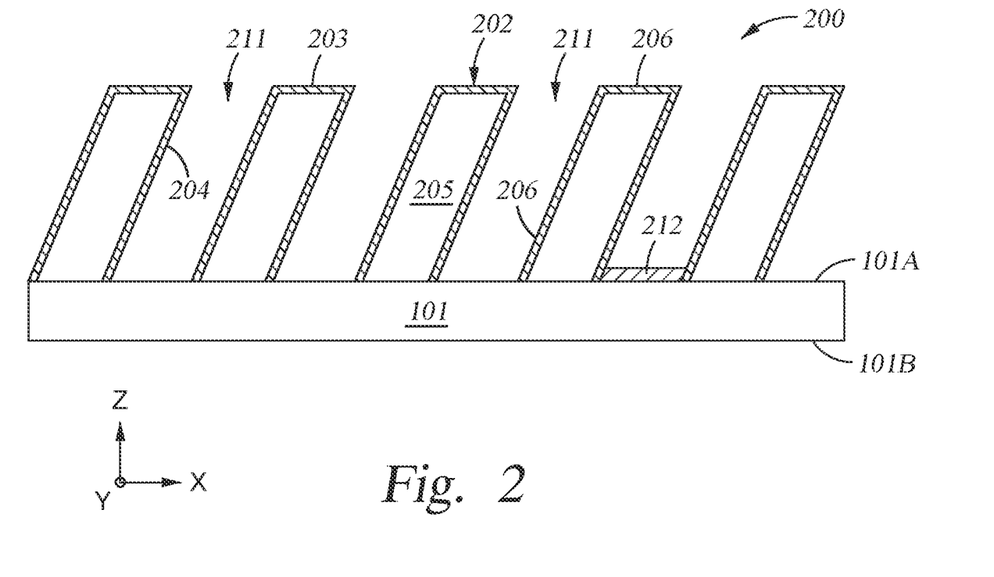
FIG. 2 is a cross-sectional view of an optical device, according to one embodiment.

FIG. 2 is a cross-sectional view of an optical device 200, according to one embodiment. The optical device 200 is formed by modifying the optical device film 105 from the optical device 100 of FIG. 1. In one embodiment, which can be combined with other embodiments described herein, the optical device 200 is a waveguide combiner, such as an augmented reality waveguide combiner. In another embodiment, which can be combined with other embodiments described herein, the optical device 200 is a flat optical device, such as a metasurface. Other optical devices that can be formed from the optical device film 105 include optical filters and dielectric mirrors.

The optical device 200 includes a plurality of optical device structures 202 disposed over (e.g., directly on) the first surface 101A of the substrate 101. The optical device structures 202 can be spaced apart from each other in the X-direction by trenches 211. In some embodiments, the trenches 211 extend down to the first surface 101A of the optical device substrate 101. The optical device structures 202 can each include a top surface 203 and side surfaces 204. The optical device structures 202 can each further include a bulk region 205 and surface regions 206. The optical device structures 202 are formed from the optical device film 105 from FIG. 1, and thus the bulk regions 205 of the optical device structures 202 are formed of silicon carbide. In some embodiments, the optical device structures 202 can be formed of another optically transparent material, for example another optically transparent material including silicon and/or carbon. In one embodiment, the optical device structures 202 are gratings for a waveguide combiner configured for use in an augmented reality device.

The surface regions 206 are formed of silicon oxycarbide. The surface regions 206 can extend along the top surface 203 and the side surfaces 204 of each optical device structure 202. Although the surface regions 206 are shown having a uniform thickness, the thickness of the surface regions 206 can vary along the top surface 203 and the side surfaces 204. The thickness of the surface regions 206 can be from about 0.1 nm to about 50 nm, such as from about 1 nm to about 10 nm, such as about 3 nm. Furthermore, the carbon content can vary within the surface regions 206 along any dimension. The accumulation of carbon in the surface regions 206 can reduce the optical performance of the optical device 200 compared to the same optical device 200 that does not include the accumulated carbon in the surface regions 206.

In some embodiments, surface regions 212 are formed over the first surface 101A of the optical device substrate 101 at the bottom of the trenches 211 as a result of the process used to form the optical device structures 202 (e.g., an IBE process). Although only one example of the surface regions 212 is shown, in some embodiments, the surface regions 212 are formed at the bottom of each trench 211. In one embodiment, the surface regions 212 can have a similar composition (e.g., formed of silicon oxycarbide) and dimensions as the surface regions 206 described above.

The plurality of optical device structures 202 can be spaced apart from each other in a direction (e.g., the X-direction) parallel to the first surface 101A of the substrate 101. The optical device structures 202 include sub-micron critical dimensions, e.g., nanosized dimensions, corresponding to the widths of the optical device structures 202 in the X-direction. In some embodiments, the optical device structures 202 may be binary structures (not shown) with side surfaces 204 perpendicular to the first surface 101A of the substrate 101. In other embodiments, the optical device structures 202 may be angled structures with at least one of the side surfaces 204 angled relative to the first surface 101A of the substrate 101. The optical device structures 202 can be formed from the optical device film 105 via one or more lithography and/or etch processes, such as an ion beam etching process on the optical device film 105.

Figure 3:
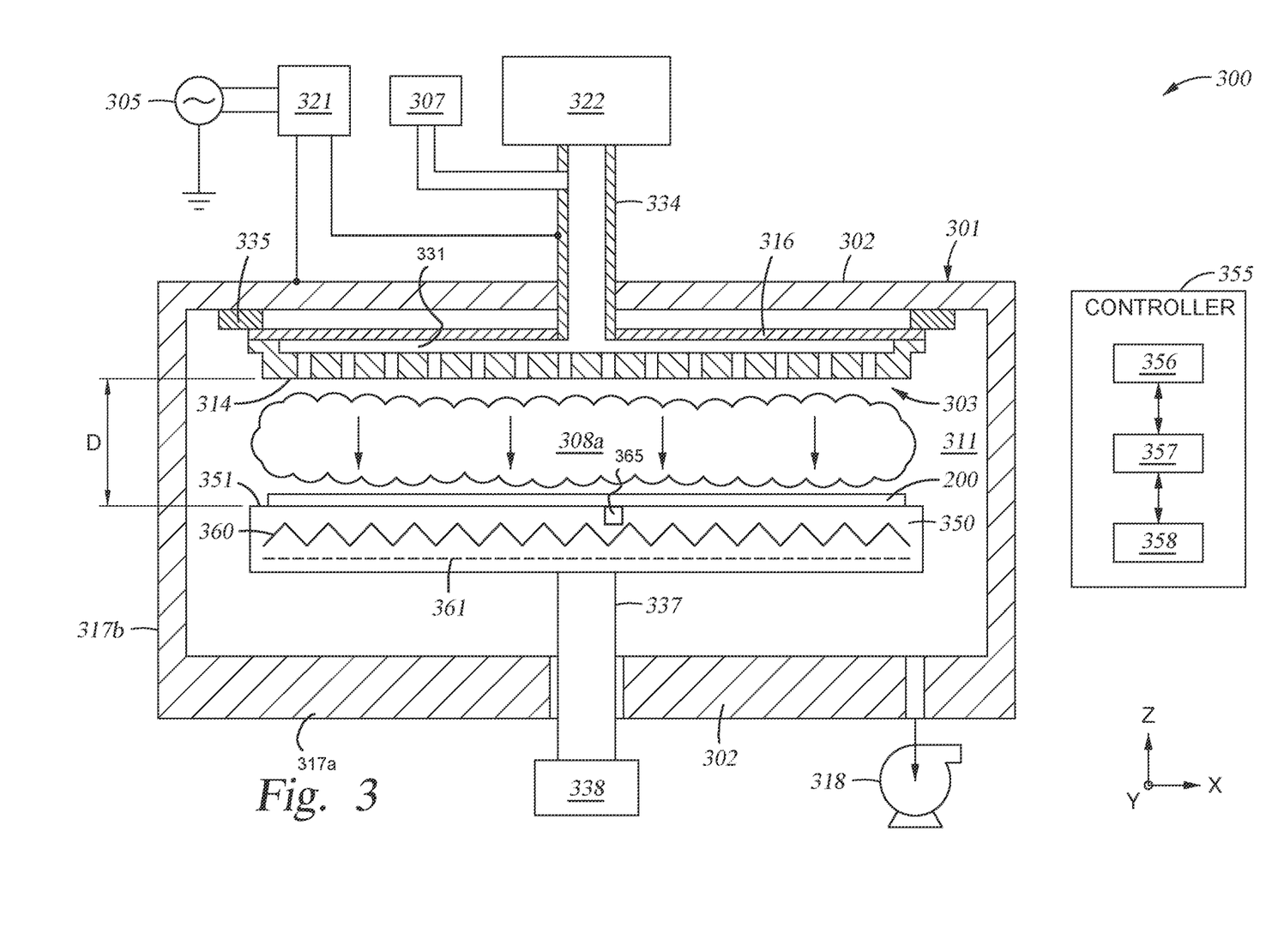
FIG. 3 is a side cross-sectional view of a plasma processing system, according to one embodiment.

FIG. 3 is a side cross-sectional view of a plasma processing system 300, according to one embodiment. The plasma processing system 300 includes a process chamber 301, a radio frequency power source 305, an optional remote plasma source 307, and a controller 355 for controlling processes performed by the processing system 300. The plasma processing system 300 can be used to generate a plasma in the process chamber 301 or supply a plasma to the process chamber 301. The optical device 200 from FIG. 2 can be exposed to the plasma to remove the carbon or substantially reduce the carbon content of the surface regions 206, 212 of the optical device 200.

The process chamber 301 includes a chamber body 302 having a bottom 317a and one or more sidewalls 317b that are disposed around a processing volume 311 (also referred to as interior volume). The process chamber 301 includes a substrate support 350 disposed in the processing volume 311. The substrate support 350 is adapted to support the optical device 200 on a top surface 351 of the substrate support 350 during processing.

The process chamber 301 further includes an actuator 338 and a shaft 337. The substrate support 350 is coupled to the actuator 338 by the shaft 337. The actuator 338 is configured to move the substrate support 350 at least vertically to (1) facilitate transfer of the optical device 200 into and out of the chamber body 302 and/or (2) adjust a distance D between the optical device 200 and a showerhead assembly 303.

The process chamber 301 can include a heater 360 in the substrate support 350 configured to provide heat to the optical device 200 during processing. In some embodiments, the heater 360 is a resistive heater embedded in the substrate support 350. In some embodiments, the process chamber 301 includes a temperature sensor 365, such as a thermocouple, configured to measure a temperature of the substrate supporting surface 351 of the substrate support 350. The controller 355 can use measurements from the temperature sensor 365 to adjust the power provided to the heater 360 to control the temperature of the top surface 351 of the substrate support 350. In some embodiments, the process chamber 301 can include an electrode 361 embedded in the substrate support 350. In some of these embodiments, the electrode 361 can be connected to an electrical ground to provide a return path for RF energy provided to the showerhead for generating the plasma in the process chamber 301 as described in further detail below.

The process chamber 301 includes a showerhead assembly 303 that is configured to supply gases to the processing volume 311 from a plurality of gas sources 322. The plasma processing system 300 also includes an exhaust system 318 configured to apply vacuum pressure to the processing volume 311. The showerhead assembly 303 is generally disposed opposing the substrate support 350, for example directly above the substrate support 350, in a substantially parallel relationship.

The showerhead assembly 303 includes a gas distribution plate 314 and a backing plate 316. The backing plate 316 may function as a blocker plate to enable formation of a gas volume 331 between the gas distribution plate 314 and the backing plate 316. The gas sources 322 are connected to the gas distribution plate 314 by a conduit 334. In one embodiment, an optional remote plasma source 307 is coupled to the conduit 334 for supplying a plasma through the gas distribution plate 314 to the processing volume 311.

The gas distribution plate 314, the backing plate 316, and the conduit 334 are generally formed from electrically conductive materials and are in electrical communication with one another. The chamber body 302 is also formed from an electrically conductive material. The chamber body 302 is electrically insulated from the showerhead assembly 303. In one embodiment, the showerhead assembly 303 can be suspended below a top of the chamber body 302 by attaching the showerhead assembly 303 to an insulator 335 that electrically separates the showerhead assembly 303 from the chamber body 302.

In one embodiment, the substrate support 350 is also electrically conductive. The electrically conductive substrate support 350 and the showerhead assembly 303 can be configured as opposing electrodes for generating a plasma 308a between the substrate support 350 and the showerhead assembly 303 during plasma processes. In one embodiment, the electrode 361 in the substrate support 350 can be connected to electrical ground of the RF power source described below.

The plasma processing system 300 can include the radio frequency (RF) power source 305 that can be used to generate the plasma 308a between the showerhead assembly 303 and the substrate support 350 during processing. The RF power source 305 may also be used to maintain energized species or further excite gases supplied from the remote plasma source 307. The plasma generated by the RF power source 305 or provided from the remote plasma source 307 can help remove carbon from the surface regions 206, 212 of the optical device 200 (see FIG. 2), which can improve the optical performance of the optical device 200.

The RF power source 305 can be coupled to the showerhead assembly 303 to supply RF power for generating the plasma. The RF power source 305 can also be connected to the chamber body 302 and the electrode 361 embedded in the substrate support 350 to allow for a return path for the RF circuit. The RF power source 305 can make these corresponding connections to the showerhead assembly 303, the chamber body 302, and the electrode 361 through an impedance matching circuit 321.

The controller 355 can be any type of controller used in an industrial setting, such as a programmable logic controller (PLC). The controller 355 includes a processor 357, a memory 356, and input/output (I/O) circuits 358. The controller 355 can further include one or more of the following components (not shown), such as one or more power supplies, clocks, communication components (e.g., network interface card), and user interfaces typically found in controllers for semiconductor equipment.

The memory 356 can include non-transitory memory. The non-transitory memory can be used to store the programs and settings described below. The memory 356 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 357 is configured to execute various programs stored in the memory 356, such as a programs configured to execute the methods 4000, 6000 described below in reference to corresponding FIGS. 4 and 6. During execution of these programs, the controller 355 can communicate to I/O devices through the I/O circuits 358. For example, during execution of these programs and communication through the I/O circuits 358, the controller 355 can control outputs (e.g., pumps and valves) and monitor inputs (e.g., sensors). The memory 356 can further include various operational settings used to control the processing system 300 (FIG. 3) and the processing system 500 (FIG. 5). For example, the settings can include settings for controlling the operating conditions (e.g., temperature, pressure, and gas concentrations) inside the process chamber 301 (FIG. 3) and process chamber 501 (FIG. 5).

Figure 4:
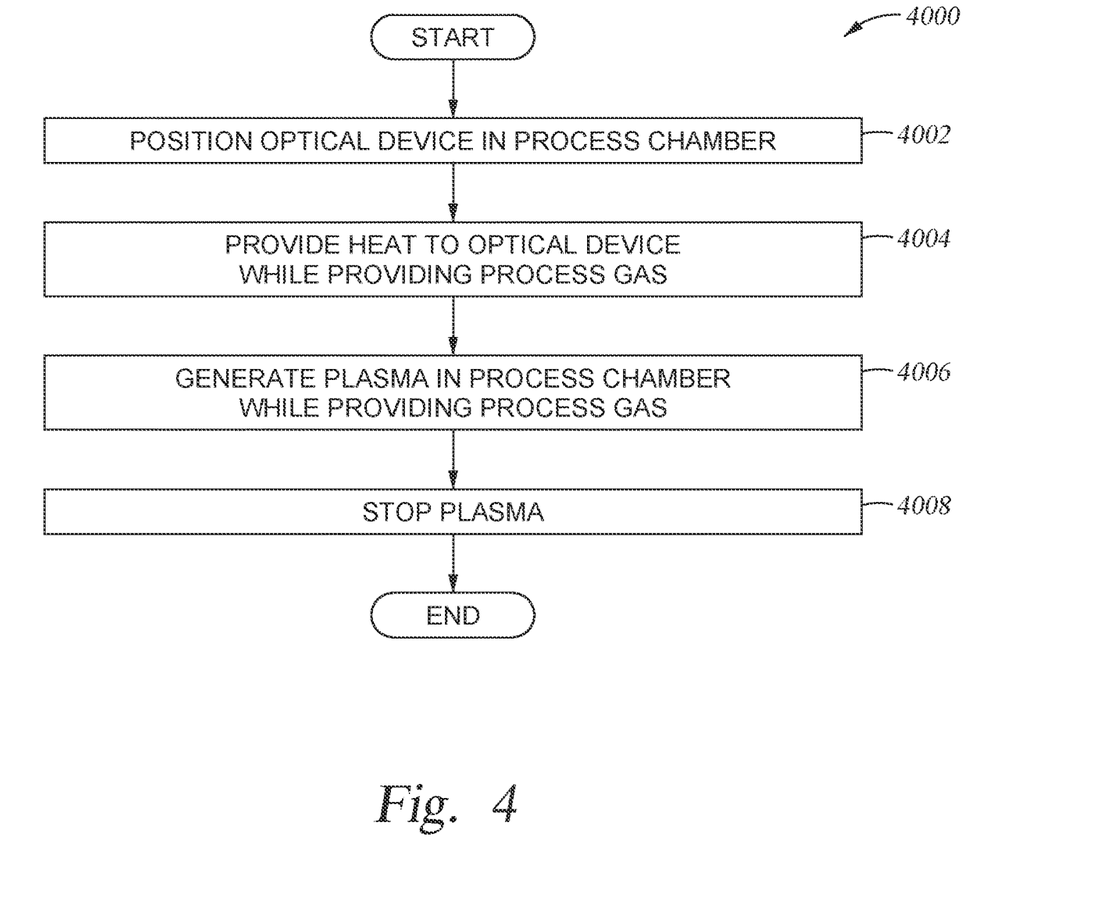
FIG. 4 is a process flow diagram of a method of performing a plasma process on the optical device shown in FIG. 2, according to one embodiment.
Figure 5:
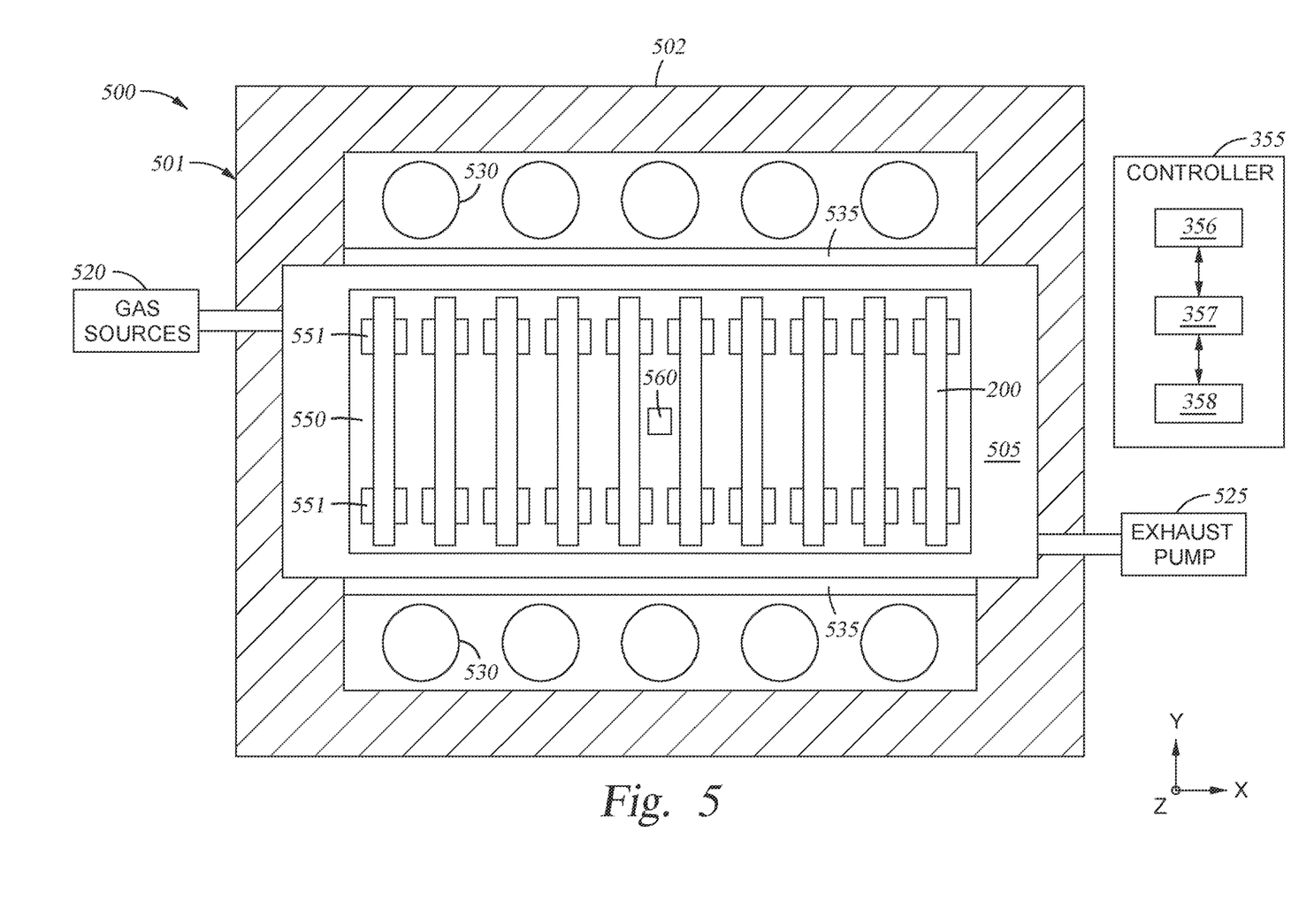
FIG. 5 is a top cross-sectional view of a batch processing system, according to one embodiment.

FIG. 4 is a process flow diagram of a method 4000 of performing a plasma process on the optical device 200 shown in FIG. 2, according to one embodiment. The method 4000 can be performed on the optical device 200 using the processing system 300 described above in reference to FIG. 3.

The method 4000 begins at block 4002. At block 4002, the optical device 200 is positioned on the substrate support 350 in the processing volume 311 of the process chamber 301.

At block 4004, heat is provided by the heater 360 to heat the substrate support 350 and the optical device 200 on the substrate support 350. The heater 360 can be used to heat the substrate supporting surface 351 to a temperature setpoint (e.g., 200° C. to 500° C.) as measured by the temperature sensor 365. Also, at block 6004 one or more process gases are provided to the process volume 311 from the gas sources 322. In some embodiments, the process gases can include one or more of hydrogen, steam, nitrogen, and oxygen. In some of these embodiments, an inert gas, such as argon, can also be provided from the gas sources 322. The controller 355 can be used to adjust power provided to the heater 360 during block 4004 to maintain the top surface 351 of the substrate support 350 at the temperature setpoint. Block 4004 can be performed for a duration extending from about five seconds to about five minutes, such as for about one minute.

At block 4006, the gases provided to the processing volume 311 during block 4004 continue to be provided to the processing volume 311 and a plasma is generated from the gases provided to the processing volume 311 from the gas sources 322. In one embodiment, RF power can be provided from the RF power source 305 to the showerhead assembly 303 to generate the plasma 308a between the showerhead assembly 303 and the substrate support 350. In one embodiment, the electrode 361 in the substrate support 350 is connected to electrical ground for the RF power source 305, so that the capacitively coupled plasma 308a can be generated in the processing volume 311 by the RF power provided to the showerhead assembly 303 from the RF power source 305. In some embodiments, the RF power provided by the RF power source 305 has a frequency of about 13.56 MHz and a power level from about 100 Watts to about 1000 Watts.

The plasma and heat provided to the interior volume 311 of the process chamber 301 during blocks 4004, 4006 can substantially reduce the carbon content in the surface regions 206, 212 of the optical device 200 (FIG. 2) by at least 50%, such as by at least 80% (e.g., ⅚ of the carbon being removed), such as by at least 90%, such as by at least 99%. By reducing the carbon content in the surface regions 206 by a substantial amount, the surface regions 206 of the optical device structures 202 obtain optical properties significantly more similar to silicon oxide. These substantially lower levels of carbon in the regions 206, 212 improve the optical performance of the optical device 200 and cause substantially lower levels of optical loss when compared to the optical device 200 including the silicon oxycarbide regions 206, 212 with higher levels of carbon.

In some embodiments, the plasma 308a can alternatively be generated in the remote plasma source 307 and provided to the processing volume 311 to expose the optical device 200 to the plasma 308a instead of being generated in the processing volume 311 by the RF power provided by the RF power source 305.

At block 4008, the plasma generation and the heat provided by the heater 360 is stopped, and the processing volume 311 of the process chamber 301 is cooled to a reduced temperature. In some embodiments, the process gas and/or the inert gas can be provided during the execution of block 6008.

FIG. 5 is a top cross-sectional view of a batch processing system 500, according to one embodiment. The batch processing system 500 includes a batch processing chamber 501, a plurality of gas sources 520, an exhaust pump 525, and the controller 355 described above in reference to FIG. 3.

The batch processing chamber 501 includes a chamber body 502 enclosing an interior volume 505. The batch processing chamber 501 includes a support 550 and a plurality of stands 551 on the support 550. The optical devices 200 can each be positioned between the stands 551 to enable the optical devices 200 to each be oriented in a vertical direction, for example with the surfaces 101A, 101B of the optical device substrate 101 (see FIG. 2) facing in the plus and minus X-directions.

The batch processing chamber 501 further includes a plurality of heating coils 530 on opposing sides of the support 550. In some embodiments, the coils 530 can each be positioned behind an infrared-transparent window 535, such as a quartz window. Power can be provided to the coils 530 during processing to heat the optical devices 200 to temperatures from about 600° C. to about 2000° C. during processing. The batch processing chamber 501 can further include a temperature sensor 560, such as a thermocouple, positioned on the support 550 near the optical devices 200 to monitor and control the temperature of the interior volume 505 during processing. The controller 355 can be configured to receive measurements from the temperature sensor 560 and modulate power provided to the coils 530 to control the temperature of the interior volume 505 during processing. In some embodiments, the batch processing chamber 501 can include two or more temperature sensors, such as five temperature sensors or ten temperature sensors (e.g., one temperature sensor for each coil 530, so that the temperature measured by each sensor can be controlled by one coil 530).

Figure 6:
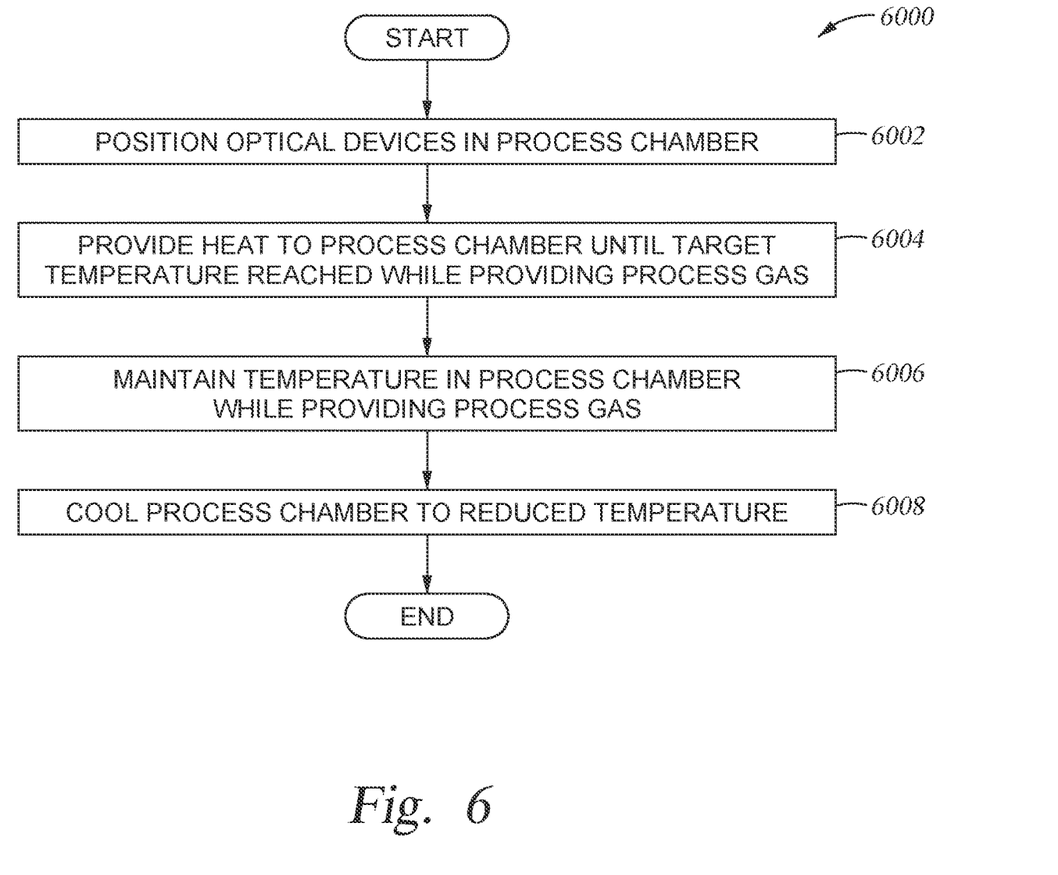
FIG. 6 is a process flow diagram of a method of performing a batch annealing process on a plurality of the optical devices shown in FIG. 2, according to one embodiment.

FIG. 6 is a process flow diagram of a method 6000 of performing a batch annealing process on a plurality of the optical devices 200 shown in FIG. 2, according to one embodiment. The method 6000 can be performed on the optical devices 200 using the batch processing system 500 described above in reference to FIG. 5.

The method 6000 begins at block 6002. At block 6002, a plurality of the optical devices 200 (e.g., ten optical devices 200 as shown in FIG. 5) are positioned on the support 550 in the interior volume 505 of the batch process chamber 501. The optical devices 200 can be positioned and vertically oriented within the stands 551. The optical devices 200 can be spaced apart from each other, for example in the X-direction of FIG. 5, so that the optical device structures 202 (FIG. 2) can be exposed to the gases provided to the interior volume 505.

At block 6004, heat is provided from the coils 530 to increase the interior volume 505 of the process chamber 501 to a temperature setpoint. In some embodiments, the temperature of the interior volume 505 is heated to a temperature from about 600° C. to about 2000° C., such as from about 900° C. to about 1400° C.

One or more process gases (e.g., hydrogen, steam, oxygen, and nitrogen) can be provided to the interior volume 505 of the process chamber 501 from the gas sources 520 during block 6004. In some embodiments, an inert gas (e.g., argon) can be used as a carrier gas to assist in flowing the one or more process gases over surfaces of the optical devices 200.

At block 6006, the controller 355 can use measurements from the temperature sensor 560 to control the power provided to the coils 530, so that the temperature measured by the temperature sensor 560 can be maintained within a specified threshold (0.5 degrees ° C.) of the temperature setpoint during processing.

The duration of block 6006 can be from about one minute to about three hours, such as from about five minutes to about one hour, such as about ten minutes. The one or more process gases and the optional inert gas from the gas sources 520 can be provided to the interior volume 505 of the process chamber 501 during block 6006.

In some embodiments, the process gas can be hydrogen ($H_2$). In some of these embodiments, the flowrate (e.g., sccm) of $H_2$ can be from about 0.1% to about 10%, such as from about 1% to about 5% (e.g., 2.8%) of the total gas flowrate (e.g., sccm) provided to the interior volume 505 of the process chamber 501 during blocks 6004 and 6006. In some of these embodiments, the remainder of the gas flowrate is provided by an inert gas, such as argon. In other of these embodiments, the remainder of the gas flowrate is provided by nitrogen.

During blocks 6004 and 6006, the pressure in the interior volume 505 of the process chamber 501 can be maintained at a pressure from about 250 Torr to about 1000 Torr, such as from about 300 Torr to about 760 Torr, such as about 400 Torr to about 500 Torr.

The heat and process gases provided to the interior volume 505 of the process chamber 501 during blocks 6004, 6006 can substantially reduce the carbon content in the surface regions 206, 212 of the optical device 200 (FIG. 2) by at least 50%, such as by at least 80% (e.g., ⅚ of the carbon being removed), such as by at least 90%, such as by at least 99%. By reducing the carbon content in the surface regions 206 by a substantial amount, the surface regions 206, 212 of the optical device 200 obtain optical properties significantly more similar silicon oxide. which improves the optical performance of the optical device 200. These substantially lower levels of carbon in the regions 206, 212 improve the optical performance of the optical device 200 and cause substantially lower levels of optical loss when compared to the optical device 200 including the silicon oxycarbide regions 206, 212 with higher levels of carbon.

At block 6008, the interior volume 505 of the process chamber 501 is cooled to a reduced temperature. In some embodiments, the process gas and/or the inert gas can be provided during some or all of the cooling down period at block 6008.

While the foregoing is directed to examples of the present disclosure, other and further examples of the disclosure may be devised without departing from the basic scope thereof, and the scope thereof is determined by the claims that follow.

What is claimed is:

1. A method of processing an optical device comprising:
    positioning the optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide;
    providing one or more process gases to the interior volume of the process chamber;
    generating a plasma of the one or more process gases in the interior volume of the process chamber for a first time period when the optical device is on the substrate support; and
    stopping the plasma after the first time period, wherein a carbon content of the one or more surface regions of each optical device structure is reduced by at least 50% compared to the carbon content of the one or more surface regions of each optical device structure before the first time period.

2. The method of claim 1, wherein the optical device substrate is formed of silicon carbide.

3. The method of claim 1, wherein the one or more process gases include one or more of hydrogen, oxygen, and nitrogen.

4. The method of claim 1, wherein the one or more process gases includes hydrogen.

5. The method of claim 1, wherein the carbon content of the one or more surface regions of each optical device structure is reduced by at least 80% compared to the carbon content of the one or more surface regions of each optical device structure before the first time period.

6. The method of claim 1, further comprising heating the optical device with a heater in the substrate support to a temperature between 200° C. and 500° C. before the plasma is generated.

7. The method of claim 6, further comprising continuing to heat the optical device with the heater during the plasma generation.

8. The method of claim 1, further comprising forming the optical device structures by etching a silicon carbide layer formed over the optical device substrate, wherein the optical device substrate is formed of silicon carbide.

9. The method of claim 8, wherein the etching is performed using ion beam etching.

10. A method of processing an optical device comprising:
    positioning the optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide;
    providing one or more process gases to the interior volume of the process chamber;
    heating the interior volume of the process chamber to a temperature of at least 600° C. for a first time period when the optical device is on the substrate support; and
    stopping the heat after the first time period, wherein a carbon content of the one or more surface regions of each optical device structure is reduced by at least 50% compared to the carbon content of the one or more surface regions of each optical device structure before the first time period.

11. The method of claim 10, wherein the optical device substrate is formed of silicon carbide.

12. The method of claim 10, wherein the one or more process gases include one or more of hydrogen, steam, oxygen, and nitrogen.

13. The method of claim 10, wherein the one or more process gases includes hydrogen.

14. The method of claim 10, wherein the carbon content of the one or more surface regions of each optical device structure is reduced by at least 80% compared to the carbon content of the one or more surface regions of each optical device structure before the first time period.

15. The method of claim 10, wherein the interior volume of the process chamber is heated to a temperature from about 900° C. to about 1400° C. during the first time period.

16. The method of claim 10, further comprising forming the optical device structures by etching a silicon carbide layer formed over the optical device substrate, wherein the optical device substrate is formed of silicon carbide.

17. The method of claim 16, wherein the etching is performed using ion beam etching.

18. A method of processing an optical device comprising:
positioning the optical device on a substrate support in an interior volume of a process chamber, the optical device comprising an optical device substrate and a plurality of optical device structures formed over the optical device substrate and spaced apart from each other, each optical device structure including a bulk region formed of silicon carbide and one or more surface regions formed of silicon oxycarbide, wherein the optical device substrate is formed of silicon carbide and the plurality of optical device structures are gratings configured for use in a waveguide combiner;
providing one or more process gases including hydrogen to the interior volume of the process chamber;
exposing the optical device to a plasma generated from the one or more process gases for a first time period when the optical device is on the substrate support; and
stopping the plasma after the first time period, wherein a carbon content of the one or more surface regions of each optical device structure is reduced by at least 80% compared to the carbon content of the one or more surface regions of each optical device structure before the first time period.

19. The method of claim 18, wherein the carbon content of the one or more surface regions of each optical device structure is reduced by at least 90% compared to the carbon content of the one or more surface regions of each optical device structure before the first time period.

20. The method of claim 18, further comprising heating the optical device to a temperature between 200° C. and 500° C. before the plasma is generated.

* * * * *